United States Patent [19]

Svala

[11] 4,150,367

[45] Apr. 17, 1979

[54] ENCODER/DECODER SYSTEM EMPLOYING PULSE CODE MODULATION

[75] Inventor: Carl G. Svala, Delaware, Ohio

[73] Assignee: International Telephone and Telegraph Corporation, New York, N.Y.

[21] Appl. No.: 813,435

[22] Filed: Jul. 7, 1977

[51] Int. Cl.² .................. H03K 13/02; H03K 13/20
[52] U.S. Cl. ..................... 340/347 AD; 340/347 DA
[58] Field of Search ............... 340/347 AD, 347 DA, 340/347 M; 325/38 R

[56] References Cited

U.S. PATENT DOCUMENTS

| | | | |
|---|---|---|---|
| 3,278,930 | 10/1966 | Boutmy | 340/347 DA |
| 3,281,828 | 10/1966 | Kaneko | 340/347 AD |
| 3,333,262 | 7/1967 | Orsen | 340/347 AD |
| 3,445,839 | 5/1969 | Engelberg | 340/347 AD |
| 3,487,304 | 12/1969 | Kennedy | 340/347 DA |
| 3,493,963 | 2/1970 | Schluter | 340/347 AD |
| 3,534,257 | 10/1970 | Charap | 340/347 AD |

OTHER PUBLICATIONS

Harknett, "Electronic Engineering", pp. 30-35, Feb. 1972.
Bares, "IBM Technical Disclosure Bulletin", vol. 10, No. 9, Feb. 1968, pp. 1372-1373.
Peled, "IBM Technical Disclosure Bulletin", vol. 18, No. 8, Jan. 1976, pp. 2686-2688.

*Primary Examiner*—Charles D. Miller
*Attorney, Agent, or Firm*—James B. Raden; Donald J. Lenkszus

[57] ABSTRACT

A codec is disclosed for encoding analog signals into compressed PCM (CPCM) and conversely for decoding CPCM information into analog signals. The signal to be encoded is compared with the decaying voltage on a capacitor, initially charged to a fixed voltage E, and being discharged through a fixed resistor to another fixed voltage — dE, the time being measured by a binary digital counter from the start of the discharge until the voltage at the capacitor terminal equals the absolute value of the analog signal to be encoded. With proper choice of constants and clock frequency, the content of the binary counter at the time of coincidence represents the desired pulse code in complementary binary form of the analog signal sample to be encoded. Only the sign bit has to be added, which can be easily obtained from the polarity of the signal sample. Conversely, at the receiving end, the CPCM signal may be decoded into analog signal samples by timing the discharge of a similar or identical RC-circuit in accordance with the received code.

17 Claims, 5 Drawing Figures

ENCODER/DECODER SYSTEM EMPLOYING PULSE CODE MODULATION

BACKGROUND OF THE INVENTION

1. Field of the Invention

This invention relates to signal coding for pulse code modulation systems and, more particularly, to coder and decoders for telephone communication systems using compressed pulse code modulation with logarithmic companding.

2. Description of the Prior Art

The demand for communication services has been steadily increasing. In meeting this demand, it has proven effective in some communication systems to convert signals presented to the system into encoded digital signals and then reconvert the encoded digital signals into signals corresponding to those originally entered into the system. One example of a communication system in which such transmission of encoded digital signals has proven to have particular utility is a telephone communication system. Several schemes for digitally encoding signals in a telephone system are known. Although these encoding schemes are useful for both digital and analog signals entered into the telephone system, they have particular utility with continuous, time-varying analog signals such as voice signals.

In one encoding scheme, the amplitude of a voice analog signal is periodically sampled and each sample is converted into a digitally encoded pulse sequence or word representing the sampled analog signal. This operation is called sampling and quantizing the analog signal. If the range of analog signal amplitudes represented by each quantum level or step of the quantizing operation is uniform for all analog signal amplitudes, the encoded signal is said to be linear pulse code modulated (hereafter LPCM). Each LPCM signal word may then be decoded to form an analog signal of an amplitude substantially corresponding to the amplitude of the analog signal sample encoded into the LPCM signal word. Since the input analog signal was periodically sampled, the resulting, periodic LPCM signal words may be reconverted into a continuous analog signal substantially corresponding to the continuous input analog signal.

In the quantizing process, the exact level of the entered analog signal at the sampling instant is, as described, approximated by one of a number of discrete values or quantum levels digitally encoded as the LPCM signal. The difference between the instantaneous amplitude of the input analog signal and the quantum level actually transmitted is called quantizing error and gives rise to what is variously known as quantizing noise or quantizing distortion.

Quantizing distortion is especially objectionable and very often intolerable when the instantaneous amplitude of the input analog signal is small, but is usually of little or no significance when the instantaneous amplitude of the input analog signal is high. This is because the low amplitude of the input signals permits a relatively low level of quantizing noise to significantly degrade the ratio of signal to noise while a higher amplitude of the input signal can tolerate greater quantizing noise within an acceptable ratio of signal to noise. It is therefore desirable to have smaller quantum levels for lower amplitudes of the input signal to achieve closer correspondence between the quantum level of the encoded signal and the actual amplitude of the input analog signal at the lower amplitudes resulting in an acceptable ratio of signal to noise. Of course the size of the quantum levels for all input signal amplitudes could be decreased, but this produces an undesirable increase in the total number of quantum levels, requiring, for example, more bits to represent the signal as a digitally encoded word.

The suggested non-linear redistribution of the size of the quantizing levels is called companding, a verbal contraction of the terms compression and expanding. The purpose of companding is then to reduce the quantizing impairment of the original signal without unduly increasing the total number of quantizing levels by quantizing on a non-linear rather than a linear basis.

It is current practice with telephone systems to compand encoded analog signals on either a "$\mu$-law" or an "A-Law" companding scheme as described by H. Kaneko in an article entitled "A Unified Formulation of Segment Companding Laws and Synthesis of Codecs and Digital Companders," published in *The Bell System Technical Journal*, September, 1970. The resulting signals are then called compressed pulse code modulated signals (hereafter CPCM) or companded pulse code modulated signals. The $\mu$-law is being generally adopted in the United States. The "gross" continuous formulation for the $\mu$-law is:

$$|y| = \frac{\ln(1 + \mu |x|)}{\ln(1 + \mu)}$$

for $-1 \leq x \leq 1$. The variable x is the relative input amplitude and y the relative output amplitude, which, in turn, is encoded into a binary number expressing the magnitude of y on a linear basis. An additional bit, the "sign-bit," indicates the polarity of the signal sample x being encoded. Typically, the magnitude of y is expressed as a 6 or 7 digit binary number, corresponding to what is conventionally referred to as 7 or 8 bit resolution (code). Accordingly, y is approximated to one out of 64 or 128 evenly distrubuted levels (disregarding the sign). Actually, in the "standard" version of CPCM adopted in the U.S., a continuous exponential (or logarithmic) companding law is not used normally. Instead, the inverse function, $x = f(y)$, is approximated by 8 linear chords or segments, each subdivided into 8 or 16 steps, depending upon the number of bits mentioned before (7 or 8). The segmented $\mu$-law is used to avoid implementation difficulties and to facilitate digital linearization features, but the resulting circuits are still somewhat complicated. It might be added that regardless of approach, a constant of $\mu = 255$ has been chosen. Separate studies show that the additional distortion caused by back-to-back operation of "continuous encoder" and "segmented decoder" or vice versa is acceptable, as such, of the order of 3% or less.

Another important feature of the compressed PCM code adopted in the United States is the fact that the binary scale which linearly represents the compressed relative signal magnitude, y, is reversed, or complemented — i.e. at zero signal level the corresponding binary code, excluding the sign bit, consists of a series of all ones, while maximum signal level magnitude is represented by all zeros. The reason for this arrangement is the desire to minimize the probability of long series of zeros which would make synchronization more difficult in PCM transmissions systems. Hence a preferred embodiment of the instant invention will generate a complementary encoded representation of the compressed relative signal magnitude y.

SUMMARY OF THE INVENTION

An object of this invention is to provide for conversion between analog and digital signals with simplicity, enabling low cost implementation with standard components including integrated circuits.

According to the invention, the analog signal is compared with the decaying voltage on a capacitor initially charged to a fixed voltage, and being discharged through a fixed resistor to another fixed voltage, the time being measured by a binary digital counter from the start of the discharge until the voltage at the capacitor terminal equals the absolute value of the analog signal sampled at the system input. With proper choice of constants and clock frequency, the content of the binary counter at the time of coincidence comprises, in complementary form, the CPCM representation of the magnitude of the sampled analog signal. The CPCM representation is completed by appending a sign bit to the counter contents, said sign bit being directly related to the polarity of the analog signal sample.

For analog-to-digital encoding, the binary counter is coupled to the output of a comparator to stop in response to the equality indication. For digital-to-analog decoding, a binary counter is incremented until its count equals the number specified by the CPCM representation transmitted from the encoder. Then, in response to completion of this count, a switch is opened to stop the capacitive discharge, and the voltage on the capacitor is used to provide an analog output signal with a polarity depending on the sign bit of the digital signal.

With reference to the $\mu$-law, the initial capacitor voltage E may be chosen equal to the full scale analog voltage, and the discharge toward a voltage $-dE$, where $d = 1/\mu$. The frequency for counting is chosen such that the full value count (64 for a 7 bit code or 128 for an 8 bit code) is reached in a time equal to $RC \ln(1 + \mu)$, where RC is the time instant of the capacitive discharge path toward $-dE$.

Thus, the continuous $\mu$-law is implemented in a simple and attractive way according to the present invention.

DESCRIPTION OF A PREFERRED EMBODIMENT

Figure 1:
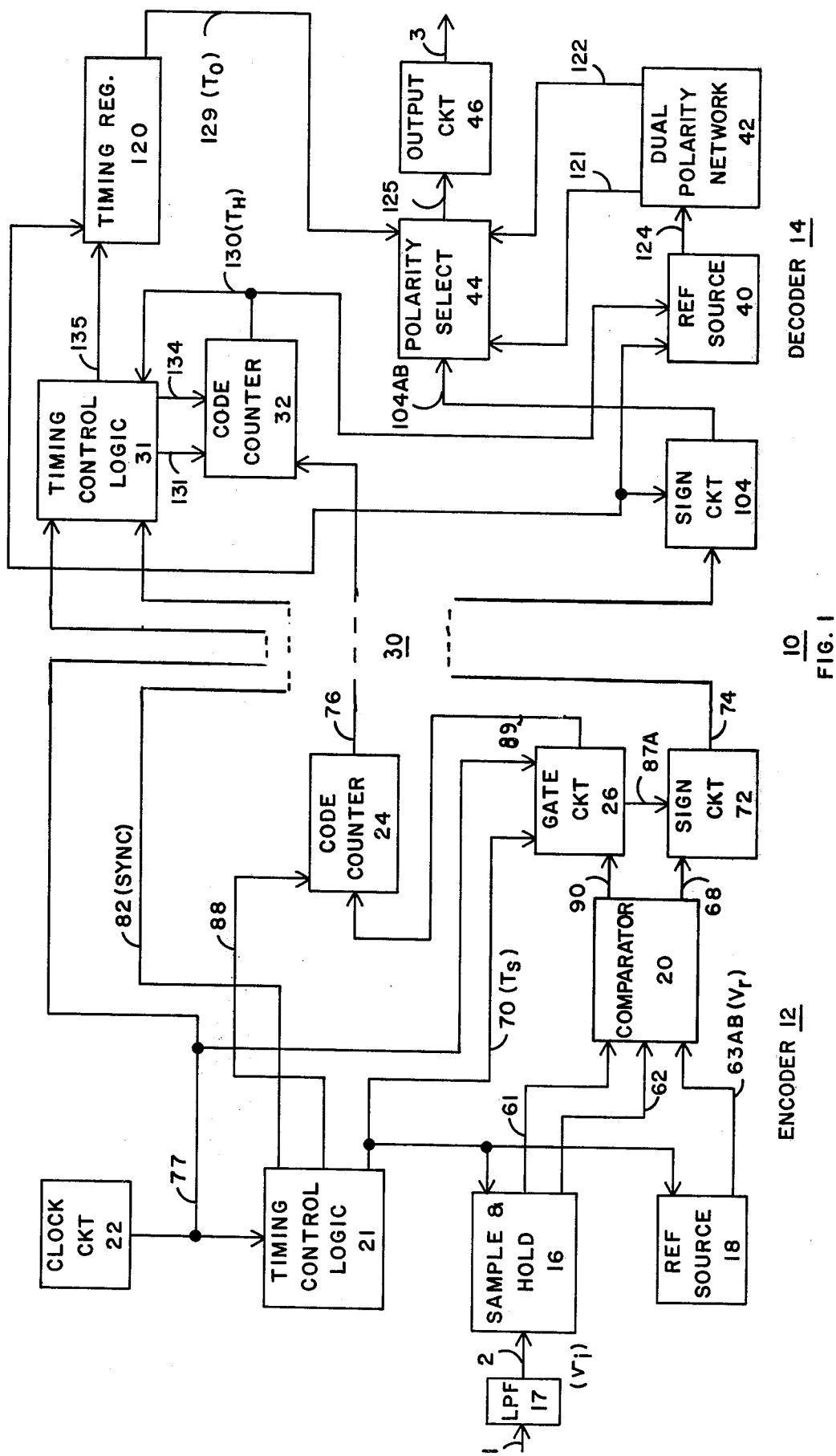
FIG. 1 is a simplified block diagram for an encoding and decoding system provided by the present invention.

Referring to the drawing, FIG. 1 is a block diagram of an encoder/decoder system 10, including an encoder 12 and a decoder 14, provided by the present invention. The system 10 has particular utility in communication systems, such as telephone systems, for enabling the transmission of continuous time varying analog signals, such as voice frequency signals, in a compressed format to increase the transmission capability of a communication link 30 which interconnects the encoder 12 at the transmitting end and the decoder 14 at the receiving end. The analog signals entered into the system on path 1 are converted into digital signals by the encoder 12 at the transmitting end. The encoded digital signals are reconverted into analog signals corresponding to those originally entered into the system 10 by the decoder 14 at the receiving end and presented to output path 3.

In accordance with the present invention, the analog signals are encoded employing a "$\mu$-law" companding scheme, such that the resulting encoded digital signals are compressed pulse code modulation signals, hereinafter referred to as CPCM signals. The continuous formulation for the "$\mu$-law" is given by the following relationship:

$$y = \frac{\ln(1 + \mu |x|)}{\ln(1 + \mu)} \qquad (1)$$

The variable x is the relative amplitude of the analog signal $v_i$, and y is the relative output amplitude, which, in turn, is encoded into a multibit binary word, representing the magnitude of y on a linear basis. An additional sign bit is provided at path 74 of FIG. 1 to indicate the polarity of the signal sample being encoded.

According to the invention, for analog-to-digital encoding, the analog signal $v_i$ is sampled, and the signal sample voltage $v_s$ is compared with a time-varying reference voltage $v_r$, which decreases from a known amplitude at a known rate. The time required for the reference signal to equal the amplitude of the signal sample voltage is measured by a binary digital counter. The binary count at the time of coincidence constitutes the compressed pulse code, in complementary form, of the analog signal. This conversion gives the encoded magnitude of the analog signal. The sign bit of the pulse code, which is related to the polarity of the analog signal, is obtained in a manner to be shown hereinafter.

Referring to FIG. 1, the time-varying analog signal $v_i$ at the output of low-pass filter 17 is sampled by a sampling circuit 16 which is enabled by a timing control signal $T_s$ on path 70 to sample the time-varying analog signal $v_i$ for a predetermined time interval. $T_s$ is provided by timing control logic 21 which is driven by clock circuit 22. At the end of the sampling interval, a comparator circuit 20 is operative during a holding interval to compare the signal output $v_s$ of the sampling circuit 16 with the time varying signal $v_r$ which is provided by a reference source 18 over path 63AB. The time varying signal $v_r$ provided by the reference source 18 decreases from a predetermined amplitude at a predetermined rate. When the amplitude of the reference signal $v_r$ has decreased to a value equal to the absolute value of the signal sample voltage $v_s$, the comparator circuit 20 provides a control output on path 90 and a sign indication output on path 68.

During the holding interval, a digital binary counter 24 is incremented by pulses provided at path 89 from gate circuit 26. Gate circuit 26 is enabled according to the logic levels on path 90 from comparator 20 and on path 70 from timing control logic 21, thereby passing clock pulses received from clock circuit 22, over path 77, to path 89. The gate circuit 26 is disabled when the control output on path 90 is provided by the comparator circuit 20, inhibiting the passage of further clock pulses to the counter 24. At such time, the multibit output word presented to path 76 at the output of the counter 24, representing the state of the counter 24, indicates the time elapsed from the start of the holding interval until coincidence of the signal sample voltage $v_s$ and the reference signal $v_r$, and thus, corresponds to the desired CPCM code representing the magnitude of the analog signal $v_i$ to which only a sign bit must be added. The sign bit is obtained by a sign circuit 72 which is controlled by the comparator circuit 20 via path 68 to provide an output at path 74 indicating the polarity of the signal sample $v_s$.

The CPCM code, including the multibit word representing the state of the counter 24, and the sign bit are extended over a suitable communication link 20 to the decoder 14 at the receiving end.

The operation of decoder 14 is basically the inverse of the operation of encoder 12. A time varying signal $v_r'$ provided at path 124 of reference source 40 of the decoder 14 is permitted to decrease in amplitude via controlled capacitive discharge at the termination of a SYNC signal on path 82 sent from encoder 12. The amplitude continues to decrease for a time determined by code counter 32 which is initialized (or pre-programmed), via path 76, to count to a vaule represented by the transmitted CPCM code.

When the predetermined count is reached, the amplitude decay at reference source 40 is terminated by signal $T_H$ on path 130. At this time, the magnitude of the reference signal $v_r'$ at path 124 corresponds to the magnitude of the originally sampled system input signal $v_s$.

The resultant reference signal $v_r'$ is extended via path 124 to dual polarity network 42 wherein the signals $v_r'$ and $-v_r'$ are generated for passage via paths 121 and 122, respectively, to polarity select circuit 44. Polarity select 44 is enabled by a sign indicator signal on path 104AB from sign circuit 104 and by a timing signal $T_O$ on path 129 from timing register 120 to pass appropriately-signed $v_r'$ on path 125 to output circuit 26 for signal conditioning and filtering. The final system analog output signal then appears at path 3.

In addition to the SYNC signal on path 82, the encoder 12 additionally forwards the basic system clock pulse stream via path 77 to decoder timing control logic 31. Timing control logic 31, in turn, controls timing register 120 via path 135 and code counter 32 via paths 131 and 134.

ENCODER

Figure 2:
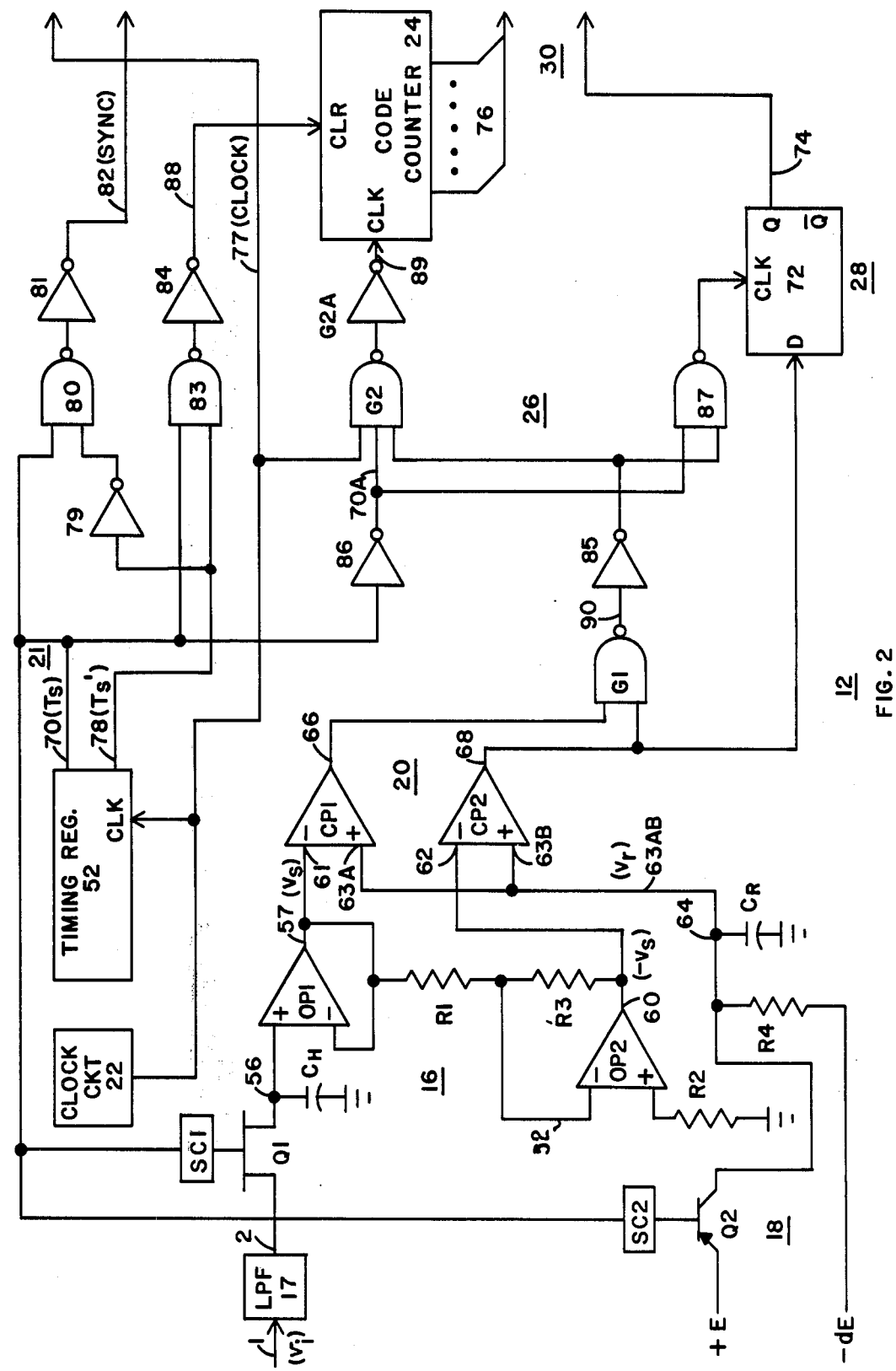
FIG. 2 is a schematic and functional block diagram of an encoder of the system of FIG. 1.

Referring to FIG. 2, which is a schematic representation of the encoder 12, the input signal $v_i$ on path 1 is extended to the sampling circuit 16 via a low pass filter 17, which may, for example, be an active filter having a cutoff frequency corresponding to the upper limit frequency of the time-varying analog signal $v_i$ to be encoded. In the present example, where it is assumed that the analog signals are voice-frequency signals, the cutoff frequency of the filter 17 may correspond to the upper limit of the voice band.

The sampling circuit 16 includes a holding capacitor $C_H$ a sampling switch embodied as an FET transistor Q1, which when enabled, connects one side of the capacitor $C_H$ to the output of the filter 17 via path 2 to receive the voice-frequency signal $v_i$ input to the system. The enabling of transistor Q1 is controlled by a switch control circuit SC1 which is enabled by a control signal $T_S$ provided by a timing register 52, to cause the transistor Q1 to conduct for the duration of the sampling interval. Switch control circuits SC1 and SC2 of the FIG. 2 and SC3, SC4, SC5 and SC6 of FIG. 3 may be simple transistor amplifiers, well-known in the art, which are arranged to provide the proper gate or base electrode voltage and polarity to the switching device to which they are respectively coupled. It is to be noted that, throughout the drawing, when a switching control circuit SCn receives a logic high, or ONE, level at its input, then the associated switching device Qn is rendered conductive, or ON. Conversely, receipt of a logic low, or 0, level at SCn renders switch Qn non-conductive, or OFF.

In the exemplary embodiment, it is assumed that a sample of the voice frequency signal $v_i$ is to be encoded every 125 microseconds. The control signal $T_S$, which is chosen to be 62.5 microseconds in duration, defines the sampling interval during which the input signal $v_i$ is sampled. The remainder of the time, 62.5 microseconds, defines a holding interval during which time the comparison is made between the signal sample $v_s$ and the reference signal $v_r$.

As seen from FIG. 2, timing signal $T_S$ is passed to switch control SC1 over path 70 from timing register 52. Timing register 52 may, for example, be an 8-bit binary counter fed at its incrementing, or CLK, input by the basic system clock pulse train presented at path 77 by clock circuit 22. With this arrangement, the timing signal $T_S$ can be taken directly from the most significant bit of the 8-bit counter output. An 8-bit counter provides 256 counting steps, and the desired encoding period, as mentioned above, is 125 μsec. Hence, a convenient frequency for clock 22 would be 256/125 μsec., or 2.048 MHz. Then with $T_S$ taken from the most significant counter output bit, the circuit generates equal sample and hold timing intervals of 62.5 μsec.

The sampling circuit 16 further includes a pair of operational amplifiers OP1 and OP2, such as the National Semiconductor types LM302 and LM318, respectively, which provide complementary output signals $v_s$ and $-v_s$, corresponding to the magnitude of the signal voltage across the holding capacitor $C_H$.

Amplifier OP1, which is connected for operation as a voltage follower, has a non-inverting input connected at point 56 to one side of capacitor $C_H$, the other side of which is connected to ground. The output 57 of the amplifier OP1 is connected directly to the inverting input of the amplifier OP1.

The output 57 of amplifier OP1 is also connected over a resistor R1 to the inverting input of amplifier OP2, which has its non-inverting input connected over a resistor R2 to ground, and its output 60 connected over a resistor R3 to the inverting input. Resistors R1 and R3 are of equal resistance, providing unity gain for the amplifier OP2 which operates in the inverting mode.

The output 57 and 60 of respective amplifiers OP1 and OP2 are respectively connected to inverting inputs 61 and 62 of a pair of operational amplifiers CP1 and CP2 which, along with NAND gate G1, comprise the comparator circuit 20. The non-inverting inputs 63A and 63B of the amplifiers CP1 and CP2 are commonly connected to the output of the reference circuit 18 via path 63AB. The amplifiers CP1 and CP2 may be the National Semiconductor Type LM311, a type selected for high speed and small offset voltage.

The reference circuit 18 comprises resistor R4, capacitor $C_R$ and a sampling switch Q2, embodied, for example, as a type 2N2904, which, when enabled, connects one side of capacitor $C_R$ at point 64 to a fixed reference potential $+E$. The other side of capacitor $C_R$ is coupled to ground potential. Resistor R4 is connected between point 64 and a negative reference potential $-dE$. The enabling of transistor switch Q2 is governed by switch control circuit SC2 which is enabled by output signal $T_S$ of timing register 52 to cause transistor Q2 to conduct for the duration of the sampling interval.

When the switch Q2 is closed, capacitor $C_R$ charges to the potential +E. When the switch Q2 is opened at the end of the sampling interval, capacitor $C_R$ discharges over resistor R4 toward the potential −dE, with the time constant being determined by the capacitor $C_R$ and the resistor R4.

The voltage $v_r$ across the capacitor $C_R$ may be expressed by $$v_r = -dE + (1+d) E \cdot e^{-t/T} \qquad (2)$$

where T is the time constant determined by the values of capacitor $C_R$ and resistor R4.

Rearranging terms, and dividing by dE yiels $$1 + \frac{v_r}{dE} = (1 + \frac{1}{d}) e^{-t/T} \qquad (3)$$

The signal sample voltage $v_s$ can be expressed as a relative amplitude "x" out of a full scale voltage $v_o$, that is $v_s = xv_o$. In accordance with the present invention, the voltage $v_r$ is compared with the signal smaple voltage $v_s$, and the time t as a function of x is determined by the time at which the capacitor voltage $v_r$ has decreased to the value of $v_s$—that is when $v_r = xv_o$. Substituting this value into equation (3), and taking the natural logarithms results in $$\ln(1 + \frac{xv_o}{dE}) = \ln(1 + \frac{1}{d}) - \frac{t}{T} \qquad (4)$$

The terms $v_o$, d, and E are constants, and, accordingly, can be chosen such that $v_o/dE$ equals $\mu$. Substituting this value into equation (4) yields $$\ln(1 + \mu x) = \ln(1 + \frac{1}{d}) - \frac{t}{T} \qquad (5)$$

Transposing terms and substituting $d = v_o/\mu E$ into equation (5) yields $$\ln(1 + \frac{E}{\mu v_o}) - \frac{t}{T} = \ln(1 + \mu x) \qquad (6)$$

Then, choosing E equal to $v_o$, and dividing both sides of the equation (6) by $\ln(1 + \mu)$ yields $$1 - \frac{t}{T \ln(1 + \mu)} = \frac{\ln(1 + \mu x)}{\ln(1 + \mu)} \qquad (7)$$

Introducing the time T′ equal to $T \cdot \ln(1 + \mu)$ gives $$1 - t/T' = \frac{\ln(1 + \mu x)}{\ln(1 + \mu)} \qquad (8)$$

Recall from previous equation (1) that $$y| = \frac{\ln(1 + \mu |k|)}{\ln(1 + \mu)} \qquad (1)$$

Comparing equations (8) and (1), it is evident that y in the continuous companding law, equation (1), equals the complement of the relative time t/T′. In other words, by choosing E equal to the full scale voltage $v_o$ of the signal to be encoded, setting $d = 1/255$, and choosing the clock frequency for the digital counter or, inversely the time constant T of the RC-circuit, so that the maximum count of the counter, that is 64, 128, etc., is obtained during a time T in $(1 + \mu)$, then the content of the counter at coincidence between $v_o$ and the absolute value of the signal sample $v_s$ directly represents the six or seven bits of the desired CPCM code to which only a sign bit must be appended.

Thus, during the sampling period, capacitor $C_H$ charges over switch Q1, and capacitor $C_R$ charges over switch Q2 to the fixed reference potential +E. At the end of the sampling period, the signal outputs $v_s$ and $-v_s$ of amplifiers OP1 and OP2, which correspond to the charge on capacitor $C_H$, represent the amplitude of the signal sample of the input signal $v_i$. When switches Q1 and Q2 are opened at the end of the sampling period, capacitor $C_H$ maintains its charge due to the high input impedance of the amplifier OP1. During the holding interval, capacitor $C_R$ discharges over resistor R4 towards the potential −dE, providing the reference voltage $v_r$ at point 64.

Also, during the holding interval, a gate G2 of the gate circuit 26 is enabled to extend clock pulses provided by a clock pulse source 22 on path 77 to the counter 24 via inverter G2A and path 89. The enabling of the gate G2 is controlled by the timing control signal $T_S$ and inverter 86, which is provided over a start counter conductor 70 during the holding interval, and by the output of a further gate 85 of the gate circuit 26, which is controlled by gate G1 of comparator circuit 20.

The outputs 66 and 68 of the comparator circuits CP1 and CP2 respectively, are combined by gate G1, which is embodied as a NAND gate, which normally provides an enabling input via inverter 85 to NAND gate G2. Gate G2 is enabled when the timing control signal $T_S$ is provided on the start count conductor 70 to gate the clock pulses provided by the clock pulse source 22 to the binary counter 24. The time constant $R4C_R$ of the reference circuit 18 and the frequency of the clock pulse source 22 are coordinated to permit the counter 24 to reach its maximum count (e.g., 64 or 128 for a 6 or 7 bit code, respectively) during a time equal to $T' = T\ln(1 + \mu)$, which may not exceed the 62.5 $\mu$sec. holding interval. A clock frequency of approximately 1 MHz may be used when a 7 bit code is desired, and a clock frequency of approximately 2 MHz may be used for an 8 bit code.

Figure 4:
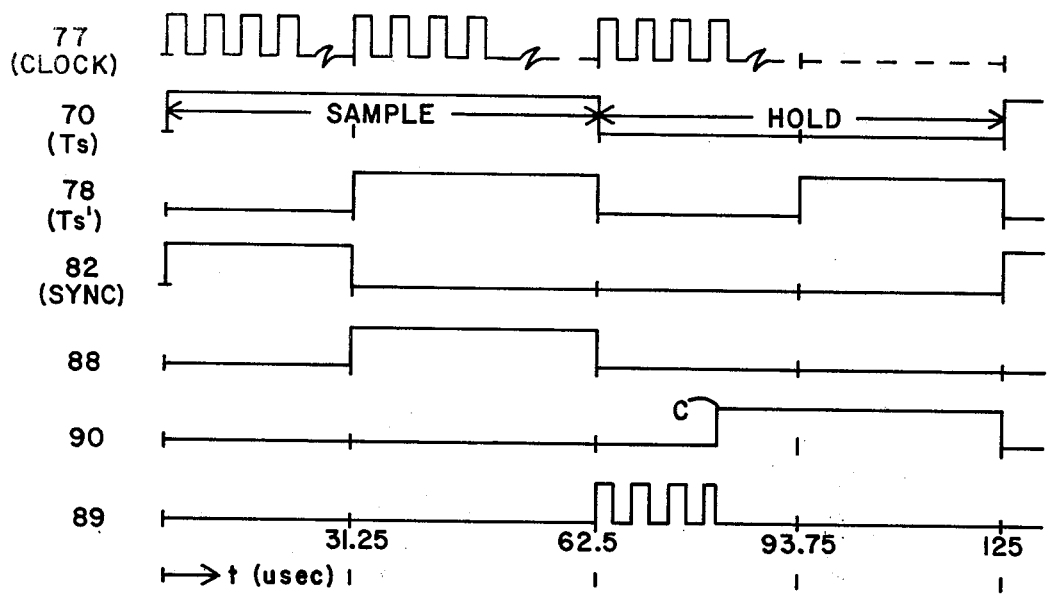
FIG. 4 and FIG. 5 are timing diagrams depicting time-related logic levels for pertinent points of FIG. 2 and FIG. 3, respectively.

If the code counter 24 of FIG. 2 is implemented with two cascaded 4-bit binary counters of the Texan Instruments type SN74193, the desired complementary code (zero magnitude corresponding to all ones and maximum magnitude corresponding to all zeros) will be obtained if the output 89 from inverter G2A is coupled to the so-called COUNT-UP terminal (designated CLK in FIG. 2), and the counter is cleared prior to the holding interval, as indicated by waveform 88 of FIG. 4 which represents the output of inverter 84 of FIG. 2. If, as described hereinabove, the timing register 52 comprises an 8-bit counter, the second-most-significant counter output bit coupled to path 78 will provide an auxiliary timing signal $T_S'$ at a 16 KHz rate which, after combination with $T_S$ at NAND gate 83 and inversion at inverter 84, provides a clear signal to counter 24 at path 88 during the last half of the sampling period. See corresponding waveforms 70, 78, and 88 of FIG. 4.

The encoded magnitude information at the outputs of code counter 24 of FIG. 2 is coupled to a set of conductors 76. The sign bit is carried on conductor 74 which is coupled to the Q output of flip-flop 72. Together, conductors 76 and 74 form a communication link 30 on which the desired CPCM code appears in parallel format during a portion of the 125 μsec. operational cycle, or frame. For convenience the cummunication link 30 is supplemented with not only the CLOCK signal on path 77 but also with a combined synchronization and read signal, SYNC, on path 82, which is a logic high during the first half of the sampling period. The SYNC signal is simply derived by inverting the $T_S'$ signal at path 78 in inverter 79 and combining it with the $T_S$ signal in NAND gate 80 and inverter 81.

When the voltage $v_r$ across capacitor $C_R$ reaches the absolute value of the sampled signal $v_s$, one of the outputs 66 or 68 of amplifier circuits CP1 or CP2, respectively, of comparator circuit 20 is disabled thereby inhibiting gate G2 via gate G1 and inverter 85 to prevent the passage of further clock pulses to counter 24, so that the count then corresponds to the encoded level of the signal sample $v_s$.

With the specific exemplary embodiment having a clock frequency of 2.048 MHz and 8-bit encoding, the time constant of the reference circuit should be chosen as 65 μsec/in$(1+\mu)$, or 11.271 μsec. for $\mu = 225$. If capacitor $C_R$ is chosen with a value of 0.01 μf, resistor R4 should have a value of 1127.1 ohms. The same values for $C_R$ and R4 would apply for a 7-bit code, provided the clock frequency is halved to 1.024 MHz, in which case a 7-bit counter would be used for timing register 52 and a 6-bit counter for code counter 24.

The output 68 of comparator circuit amplifier CP2 is also extended to sign circuit 72 comprised of D flip-flop 72. The D input of flip-flop 72 is coupled to the output 68 of CP2. The true, or Q output of flip-flop 72 is extended over path 74, which comprises a part of communication link 30, to transmit the sign bit to decoder 14 at the receiving end of the system. The clock input CLK of flip-flop 72 is coupled to the output of NAND gate 87 which receives the inverted $T_S$ signal via inverter 86 and the inverted output from gate G1 via inverter 85. The D flip-flop 72 will retain the value of the signal appearing at the D input during a positive-going transition of the signal appearing at the CLK input. Such a transition occurs during the encoding (or hold) interval when the absolute value of the sampled signal $v_s$ coincides with reference capacitor voltage $v_r$ and accordingly when the output of gate G1 is disabled. As a result, gate 87 is also disabled producing a positive-going signal at its output thus locking the flip-flop 72 to the corresponding logic level at the output 68 of CP2, which is logic ONE, or high, for positive $v_s$. In the case of a negative polarity for $v_s$, the output of CP2 will be logic ZERO, or low.

Accordingly, the Q output of flip-flop 72 will remain low to provide the proper sign information for the encoded signal sample. The inverted $T_s$ signal at path 70A will maintain the CLK input high during the sampling interval, thus maintaining the proper sign information on path 74 for read-out, independent of any transition occuring at the comparator output 68 during this time interval.

OPERATION OF THE ENCODER

The operation of encoder 12 is best described in conjunction with the schematic diagram of FIG. 2 and the encoder timing diagram of FIG. 4. The idealized logic signal levels as a function of time are set forth in FIG. 4 for various pertinent points of the schematic of FIG. 2. The designations for each waveform of FIG. 4 correspond to identical path designations used in FIG. 2.

In the exemplary embodiment, where it is assumed that a sample of the voice frequency signal $v_i$ is to be encoded every 125 μsec., the timing register 52 of FIG. 2 provides a control output signal $T_s$ at path 70 for 62.5 μsec. at the start of each 125 μsec. encoding period. During this sampling interval, the input signal $v_i$ is sampled, the counter 24 is reset via a positive going pulse on path 88, and the capacitor $C_R$ is charged to the reference potential $+E$. The 62.5 μsec. time assures full tracking of the input signal $v_i$, since FET transistor switch Q1 is held conductive during the sampling period by the associated switch control circuit SC1. The "on" resistance of Q1 and the capacitance of the holding capacitor $C_H$ provide a charging time constant low in comparison with the highest voiceband frequency of the sampled input signal.

The transistor switch Q2 is also held conductive for the duration of the positive logic signal $T_s$ by its associated switch control circuit SC2. Gate G2 is inhibited during this sampling interval by a logic low level at 70A. At the end of the 62.5 μsec. sampling interval, signal $T_s$ goes low to turn off switches Q1 and Q2 via switch control circuits SC1 and SC2, respectively. Also at this time, gate G2 is enabled to pass clock pulses at path 77 via inverter G2A to code counter 24 at path 89.

The voltage sample $v_s$ provided by capacitor $C_H$ appears at the output of operational amplifier OP1, which exhibits a high impedance to the holding capacitor $C_h$ thus avoiding discharge. Amplifier OP2 provides a reverse polarity voltage $-v_s$. The signals $v_s$ and $-v_s$ are extended to inputs 61 and 62 of the comparator amplifiers CP1 and CP2, respectively. With polarities shown in FIG. 2, the outputs of both amplifiers CP1 and CP2 are high as long as the capacitor voltage $v_r$ is greater than $v_s$. Accordingly, during the holding interval, the output of NAND gate G1 at path 90 is low, which together with the low level on the start count conductor 70, enables NAND gate G2 to pass clock pulses from the clock pulse source 22 to the counter 24. When either one of the comparator amplifiers CP1 or CP2 switches due to coincidence of $v_s$ and $v_r$, the corresponding output goes low, enabling gate G1, which, via inverter 85, inhibits gate G2, preventing further incrementing of the counter 24. See, for example, point C of waveform 90 of FIG. 4, where the output of G1 goes high to inhibit further incrementing of counter 24 by clock pulses 89. Depending on the polarity, that is which of the amplifiers CP1 or CP2 switches, the sign bit flip-flop 72 is either set low or high. For example, when the sample $v_s$ is of positive polarity, then at magnitude coincidence with $v_r'$ output 66 of CP1 will go low and output 68 will remain high, resulting in a logic ONE being gated to D flip-flop 72 thus setting the logic level of path 74 to ONE. Conversely, when the sample $v_s$ is of negative polarity, then at magnitude coincidence with $v_r$, output 68 of CP2 will go low resulting in a logic ZERO being gated to the ouput 74 of D flip-flop 72. D flip-flop 72 is activated to accept the signal presented to input D when a low-to-high signal transition is presented to input CLK at the output on NAND gate 87. As seen from FIG. 2 and FIG. 4, such a low-to-high transition occurs when output 90 of gate G1 goes high while output 70A of inverter 86 is high (specifically, see time point C of waveform 90 of FIG. 4).

The multibit code provided on conductors 76 at the output of the counter 24 and the sign bit provided on conductor 74 by the sign bit flip-flop 72 are transmitted to the decoder 14 at the receiving end where the CPCM code is reconverted to an analog signal, corresponding to the input signal $v_i$ entered into the system.

DECODER

Figure 3:
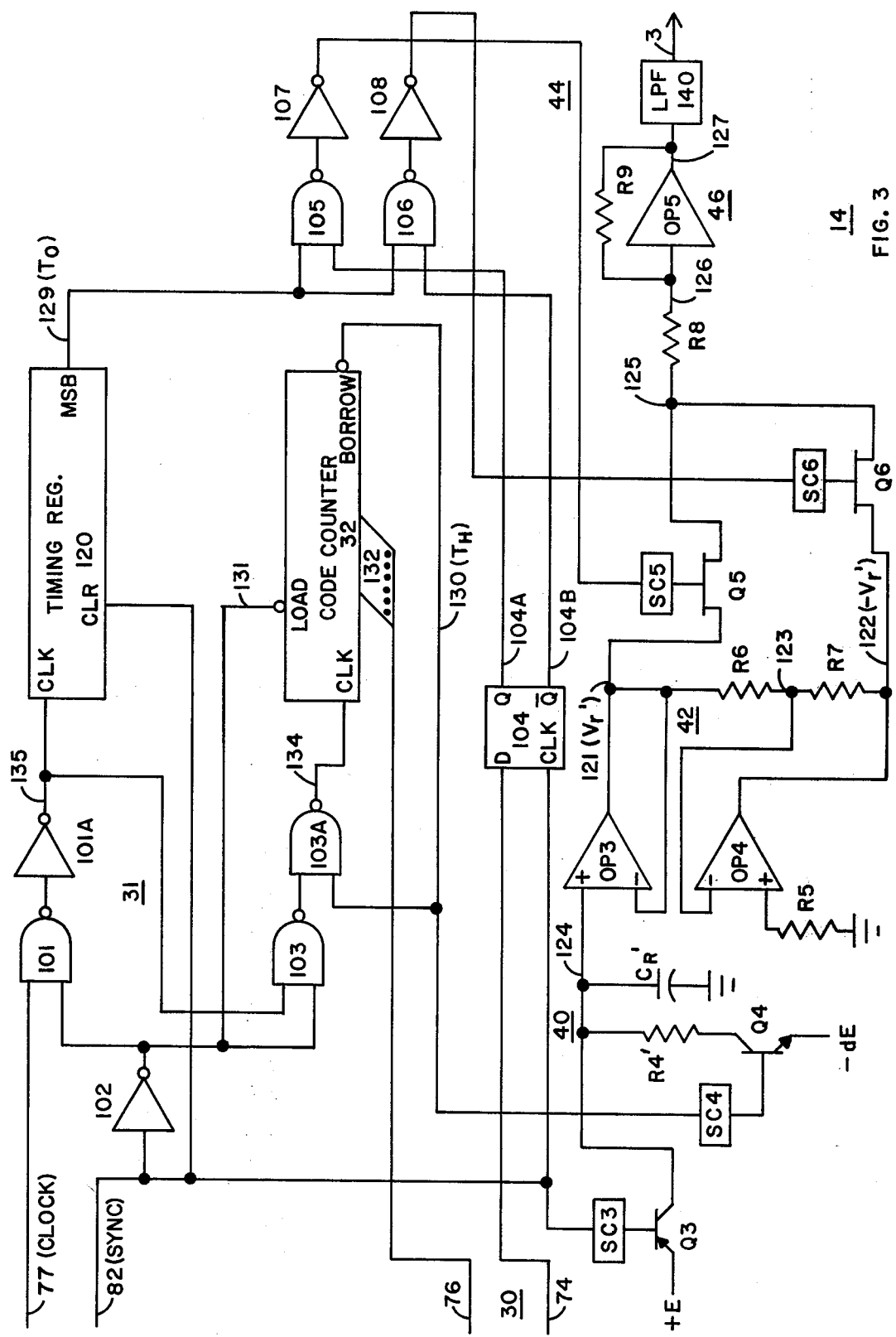
FIG. 3 is a schematic and functional block diagram of a decoder of the system of FIG. 1.

Referring to FIG. 3 which is a schematic representation of the decoder designated 14 in FIG. 1, the bits of the CPCM code, representing the resultant contents of counter 24 of FIG. 2, are transmitted over the communication link 30 and then extended at the decoder of FIG. 3 to the data inputs 132 of code counter 32 via timing control logic gates 101, 101A, 103, and 103A. Counter 32 may, for example, be comprised of two cascaded type SN54139 programmable 4-bit counters, commercially available from Texas Instruments, Inc. Such a counter will register the code presented at data inputs 132 when a low logic level is applied to the LOAD input (via path 131 in FIG. 3), decrement its output value on positive-going logic level transistion of a CLK (or COUNT-DOWN) input at path 132 of FIG. 3, and produce a low logic level (or 0) pulse at its BORROW output (connected to path 130 in FIG. 3) equal in width to the CLK (or COUNT-DOWN) input when an underflow condition exists — i.e. when the count according to the CLK input exceeds the preset or programmed, value originally loaded into the counter at data inputs 132.

SN54193 counters may also be utilized to construct 8-bit timing register 120 whose most significant output bit MSB is used to provide output strobe pulse $T_O$ at path 129 which is, in turn, coupled to enabling inputs of NAND gates 105 and 106. The incrementing pulse train for the CLK (or COUNT-UP) input of timing register 120 is furnished by the output of inverter 101A via path 135.

The sign circuit for the decoder is comprised of D flip-flop 104. The sign bit to be registered is coupled to the D input of 104 via path 74, and the flip-flop is enabled by a positive-going logic signal at its CLK input by the SYNC signal appearing on path 82. The Q and Q complementary outputs of sign flip-flop 104 are respectively coupled via path 104A and 104B to NAND gates 105 and 106.

Reference source 40 of decoder 14 is comprised of switch control circuits SC3 and SC4, transistor switches Q3 and Q4, voltage supplies +E and −dE, and discharge timing elements consisting of resistor R4′ and $C_R'$. Switch control circuits SC3 has its input coupled to the SYNC signal on path 82 and its output coupled to the base of PNP transistor switch Q3. The emitter of Q3 is coupled to DC source +E while the collector of Q3 is coupled to one common terminal of resistor R4′, capacitor $C_R'$, and the non-inverting input to operational amplifier OP3 at path 124. The opposite terminal of $C_R'$ is coupled to ground potential, while the opposite terminal of R4′ is coupled to DC potential −dE via the collector-to-emitter path of NPN transistor switch Q4. Q4 is controlled by switch control circuit SC4 whose output is coupled to the base of Q4 and whose input is coupled to the BORROW output of code counter 32 at path 130.

The decoder's dual polarity network 42 is comprised of operational amplifiers OP3 and OP4 (which may, for example, be National Semiconductor types LM 302 and LM 318, respectively) and biasing resistors R5, R6, and R7. The output of OP3 at path 121 is coupled to the inverting input of OP3 and, via R6, to node 123 which is coupled to inverting input of OP4. Resistor R7 is coupled between node 123 and the output of OP4 at path 122, while resistor R5 is coupled between ground potential and the non-inverting input to OP4. The output of OP3 at path 121 is coupled via FET switch Q5 to point 125, while the output of OP4 at path 122 is coupled via FET switch Q6 to point 125.

The decoder's polarity select circuit 44 is comprised of gates 105, 106, 107, and 108, switch control circuits SC5 and SC6, and FET switches Q5 and Q6. NAND gate 105 and inverter 107 gate the Q output of sign flip-flop 104 to the input of switch control circuit SC5, while NAND gate 106 and invertor 108 gate the Q output of sign flip-flop 104 to the input of switch control circuit SC6. FET switches Q5 and Q6 have output electrodes commonly tied to the input of output circuit 46 at path 125.

The decoder's output circuit 46 is comprised of operational amplifier OP5, biasing resistors R8 and R9, and voice-band (low pass) filter 140. Resistor R8 is coupled between the input 125 of output circuit 46 and the input of buffer operational amplifier OP5 at path 126. Feedback resistor R9 is coupled between the input of OP5 at path 126 and the output of OP5 at path 127, which, in turn, is coupled via low pass filter 140 to the system output at path 3.

DECODER OPERATION

The operation of decoder 14 is best described with reference to the schematic diagram of FIG. 3 and the decoder timing diagram of FIG. 5. All waveforms in FIG. 5 are designated with the same reference numerals used to designate corresponding paths in the schematic diagram of FIG. 3.

Each 125 $\mu$sec. decoding cycle begins with receipt of a 31.25 $\mu$sec. positive-going SYNC signal at path 82 which performs the following function: (a) disables the timing register 120 CLK input by clamping it to a low logic level via inverter 102, NAND gate 101 and inverter 101A; (b) clears the contents of timing register 120 to zero by providing a logic ONE to the CLEAR input thereto; (c) gates the sign bit value present on path 74 into D flip-flop 104 providing a positive-going logic level transition at the CLK input thereto; (d) presets the code counter 32 to a value represented by the CPCM code at data inputs 132 by providing a logic zero via inverter 102 to the LOAD input of counter 32; (e) disables the CLK input to counter 32 at path 134 by clamping it to logic level zero via NAND gates 103 and 103A; and (f) enables switch Q3 via switch control circuit SC3, thereby recharging reference capacitor $C_R'$ to a voltage substantially equal to +E. Additionally, during the SYNC 31.25 $\mu$sec. interval, the BORROW output of counter 32 is high thereby providing via path 130 an enabling signal to switch control cirucit SC4 which renders switch Q4 conductive.

At the termination of the SYNC pulse on path 82, switch Q3 is opened permitting capacitor $C_R'$ to begin discharging through Q4 and R4′ towards the voltage −dE. The discharge time constant, $R4'C_R'$, is selected to be identical to that of the associated time constant for the encoder of FIG. 2, $R4C_4$. In this way the reference discharge time constant and the clock frequency of the signal at path 77 will be coordinated at decoder 14 in a manner identical to that relationship used for the encoder of FIG. 2. Also, when the SYNC pulse goes low, timing register 120 begins counting according to the pulse repetition rate present on path 77 which is passed to the CLK (COUNT-UP) input of 120 at path 135 via NAND gate 101 and inverter 101A. Additionally at this time, code counter 32 begins counting down toward zero from the value previously set at its data inputs 132 according to the CPCM code set by the encoder over path 76. The counting function is initiated by passing the pulse train now present at path 135 to the CLK (COUNT-DOWN) input of counter 32 at path 134 via NAND gates 103 and 103A.

Figure 5:
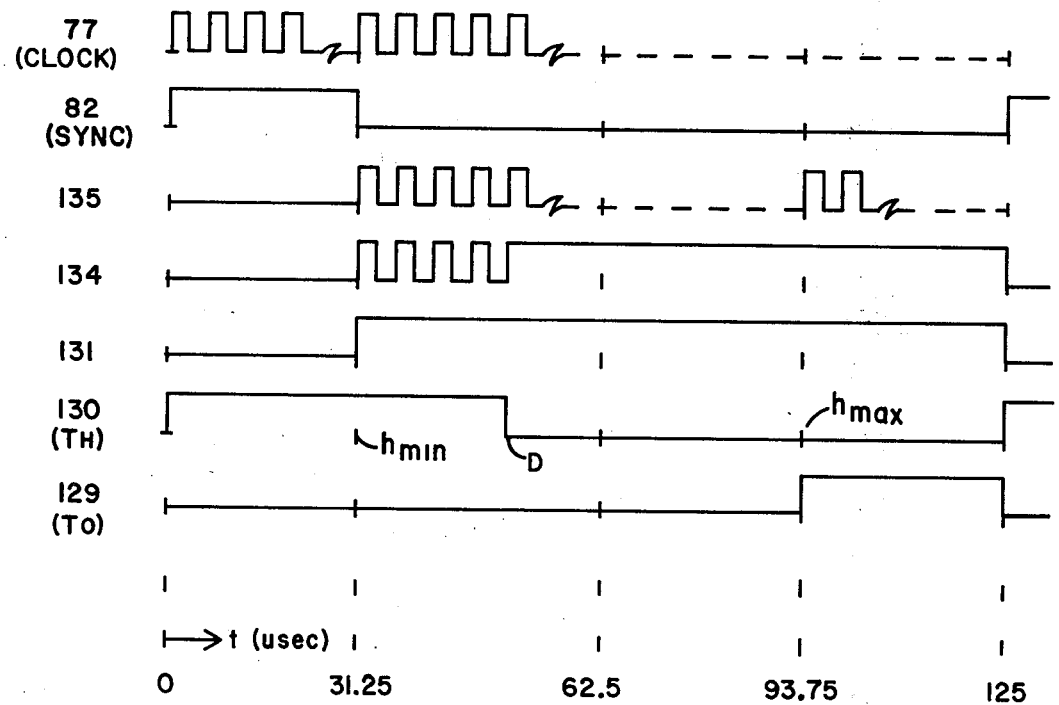

Hence, as seen from the timing diagram of FIG. 5, after the various initialization functions described above in conjunction with a logic high SYNC pulse at path 82, counters 32 and 120 begin decrementing and incrementing, respectively, according to pulses received at paths 134 and 135, respectively. Simultaneously, capacitors $C_R'$ begins to discharge from a maximum potential $+E$ towards the minimum potential $-dE$ for a time period determined from the value loaded into counter 32 at data inputs 132 corresponding to the CPCM code transmitted in the previous 125 $\mu$sec. cycle from the encoder of FIG. 2. When this predetermined down-count has been reached at code counter 32, then on the next positive-going logic level transition at path 134, signal $T_H$ on path 130 goes low to open switch Q4 via SC4 and hence initiate the hold interval for capacitor $C_R'$ (see point D of waveform 130 of FIG. 5).

Hence, it is seen from FIG. 3 and FIG. 5 that the decoder hold interval may begin with cessation of clock 32 decrementation as early as $h_{min.}$ (31.25 $\mu$sec.) of FIG. 5 (corresponding to an all-zero CPCM code representing maximum analog magnitude E) and as late as $h_{max}$ (93.75 $\mu$sec.) of FIG. 5 (corresponding to an all-ones CPCM code representing minimum analog magnitude 0). Let the voltage on $C_R'$ at the initiation of the hold interval be represented by $v_r'$. Then during the hold interval, the above-discussed configuration of amplifiers OP3 and OP4 of dual polarity network 42 is such that a voltage of $+v_r'$ is developed at path 121, while a voltage of $-v_r'$ is developed at path 122.

As previously described hereinabove in conjunction with FIG. 3 and FIG. 5, 8-bit timing register 120 began counting from zero at the termination of the SYNC pulse, 31.25 $\mu$sec. into the decoder operation cycle. Since the counting rate at path 136 is determined by the 2.048 MHz clock rate on path 77, it is seen that the most-significant output bit, MSB, of counter 120 will go high (logic ONE) 62.5 $\mu$sec. after counting has been initiated. This results in the positive-going output strobe $T_O$ at path 129 (shown as waveform 129 in FIG. 5) at a time 93.75 $\mu$sec. into the decoder operation cycle. Logic ONE at path 129 primes NAND gates 105 and 106 for respective enablement according to the sign bit value registered in D flip-flop 104. If the sign bit was one, indicative of a positive polarity, the switch control SC5 is enabled via NAND gate 105 and inverter 107 to render switch Q5 conductive, thereby passing $+V_r$ to the output circuit 46 at path 126. Alternatively, if the sign bit was ZERO, indicative of a negative polarity, then switch control circuit SC6 is enabled via NAND gate 106 and inverter 108 to render switch Q6 conductive, thereby passing $-v_r$ to the output circuit 46 at path 125.

Hence, at a constant time reference point in each decoder cycle of operation (i.e. at 93.75 $\mu$sec. thereof), an appropriately decoded output signal, plus or minus $v_r'$, is presented to the system's analog output at path 3 via amplifier OP5 and voice band filter 140. Gating the output $\pm v_r$ at a fixed time reference in each operating cycle avoids deterioration of proper output signal phasing with respect to the originally sampled system input analog voltage waveform at the encoder of FIG. 2.

With the arrangement set out hereinabove, the output signal is available at the system output only while $T_o$ is high — i.e. for one-fourth of the 125 $\mu$sec. time frame. Hence, the average of the output signal extracted by filter 140 is attenuated by a factor of four, absent corrective amplification. This loss can easily be compensated for in the exemplary embodiment by choosing the value of R9 to be four times the value of R8, thereby providing operational amplifier OP5 with a gain of four.

It should be noted that the invention described herein has been illustrated with reference to a particular embodiment. It is to be understood that many details used to facilitate the description of such a particular embodiment are chosen for convenience only and without limitation on the scope of the invention. Other embodiments may be devised by those skilled in the art without departing from the scope and spirit of the invention. For example, for reasons set forth hereinabove, the illustrative embodiment is arranged to generate a so-called complementary CPCM code, wherein maximum analog signal magnitude is represented by all-zeros, while minimum analog signal magnitude is represented by all-one. It would be relatively simple to achieve an alternative arrangement wherein a straight binary CPCM representation is encoded — i.e. where a minimum magnitude would correspond to the all-zero code and the maximum amplitude to the all-one code. One could merely invert the resultant contents of code counter 24 of FIG. 2 prior to transmittal to the decoder of FIG. 3 (or count-down from a preset maximum at counter 24). Code counter 32 of the decoder of FIG. 3 would then be arranged to receive counting inputs at a COUNT-UP input, and a negative-going signal at its CARRY output would be used in place of BORROW. (The CARRY output of the suggested SN54139 type counter produces the desired pulse when the counter overflows).

As an additional alternative arrangement, one might not wish to separately send CLOCK and SYNC pulses over separate paths from the encoder of FIG. 2 to the decoder of FIG. 3. For example, in T1-formatted data links, techniques are well-known in the art for deriving the basic system clock repetition rate and a synchronizing pulse from the incoming data stream itself. Additionally, in arrangements such as that used with R1 format, it would be obvious to one skilled in the art to arrange the system of the illustrative embodiment for transmittal of a framing bit per frame of N channels in addition to the CPCM samples corresponding to each channel.

Accordingly, the instant invention is intended to be limited only by the scope and spirit of the appended claims.

I claim:

1. A method of relating a digital compressed pulse code modulation signal representation with an analog signal potential value comprising the steps of
    (a) charging a capacitor to a first predetermined potential of a first polarity,
    (b) initializing the contents of a counter to a predetermined starting state,
    (c) discharging said capacitor through a resistance toward a second predetermined potential of an opposite polarity, and (d) Stepping said counter at a predetermined counting rate starting at the beginning of said discharging and continuing until the potential on said capacitor equals the magnitude of said analog signal potential value, wherein said first and second predetermined potentials, said predetermined counting rate, and the discharge time constant for said capacitor and said resistance are chosen in accordance with a predetermined logarithmic companding law such that the number of steps counted by said counter comprises the basis for relating said compressed pulse code modulation signal representation with said analog signal potential value, and wherein said predetermined logarithmic companding law is the μ-law, said first predetermined potential equals the full-scale potential of said analog signal and said second predetermined potential equals the negative of said first predetermined potential divided by the value of μ for said μ-law.

2. The method as set forth in claim 1, wherein predetermined counting rate is chosen such that the time, T', required to count a predetermined maximum number of steps is $T' = T \ln(1+\mu)$ seconds, where T is the time constant for said capacitor and said resistance, and said compressed pulse code modulation signal representation comprises the binary number representation of the number of steps counted by said counter.

3. The method as set forth in claim 2 for analog-to-digital encoding, wherein step (b) further comprises the sampling of an analog input signal and the holding of the potential thereof as the analog signal potential to be encoded, and wherein step (c) is terminated when the potential on said capacitor has discharged to a value equal to the magnitude of said potential to be encoded.

4. The method as set forth in claim 3 wherein step (b) further comprises the deriving of an inverted analog potential from said potential to be encoded which is substantially equal in magnitude and opposite in polarity to said potential to be encoded, and wherein step (d) further comprises separately comparing the discharging capacitor potential to said inverted potential and to said potential to be encoded and deriving a sign indicator bit in dependence upon which of the separate comparisons indicates equality at the termination of the stepping of said counter.

5. The method as set forth in claim 2, for digital-to-analog decoding, wherein said predetermined starting state of said counter in step (b) comprises an input compressed pulse coded digital signal word to be decoded, and wherein step (d) further comprises decrementing said counter by said stepping until said counter reaches the zero state, and using the resultant potential on said capacitor as the magnitude for a decoded analog signal output.

6. The method as set forth in claim 5 including the further steps of deriving an inverted potential substantially equal in amplitude and opposite in polarity to said resultant potential, selecting said resultant potential as the decoded analog signal output whenever the sign indication bit of said digital signal word to be decoded indicates a positive polarity, and selecting said inverted potential as the decoded analog signal output whenever said sign indication bit indicates a negative polarity.

7. Conversion apparatus for relating the value of a digital compressed pulse code modulation signal to the value of an analog signal in accordance with a predetermined logarithmic companding law, comprising a capacitor and resistance means connected in a series circuit, means for charging said capacitor to a first potential of a first polarity and for thereafter discharging said capacitor through said resistance means toward a second potential of an opposite polarity, counting means, means for stepping said counting means at a given frequency during an interval of time starting at the beginning of said discharge and continuing until the absolute value of the potential on said capacitor equals the absolute value of a sample of said analog signal, said first and second potentials and the relation of said given frequency to the time constant of said capacitor and said resistance means being chosen in accordance with said predetermined logarithmic companding law such that the number of steps counted by said counter during said interval of time is a simple function of said compressed pulse code modulation signal value except for a sign bit, and wherein said predetermined logarithmic companding law is the μ-law, said first predetermined potential equals the full-scale potential of said analog signal and said second predetermined potential equals the negative of said first predetermined potential divided by the value of μ for said μ-law.

8. Conversion apparatus as set forth in claim 7 wherein said given frequency is selected such that the time T' required for said counter to count a predetermined maximum number of steps is $T' = T \ln(1+\mu)$ seconds were T is the time constant for said capacitor and said resistance means, and said compressed pulse code modulation signal value comprises the binary number representation of the number of steps counted by said counter.

9. Conversion apparatus as set forth in claim 8, including sample and hold means for sampling said analog input signal and for holding the potential thereof as a sample of the potential of said analog signal value, comparison means having inputs coupled to said sample and hold means and to said capacitor to compare the absolute value of the potential of said sample to the absolute value of the potential on said capacitor and responsive to equality thereof to produce a comparison output signal, and means responsive to said comparison output signal to stop said counting means to thereby end said interval of time.

10. Conversion apparatus as set forth in claim 9, further including sample inverting means coupled to said sample and hold means to derive an inverted signal which is substantially equal in magnitude and opposite in polarity to said sample, and wherein said comparison means comprises a first and a second comparator, said sample and hold means being coupled to a first input of said first comparator, said sample inverting means being coupled to a first input of said second comparator, and said capacitor being coupled to second inputs of said first and second comparators, said comparison output signal being provided by said first comparator when said sample is the same polarity as said first potential, and said comparison output signal being provided by said second comparator when said sample is of the opposite polarity with respect to said first potential, and sign bit means including a bistable device coupled to said comparison means to be set to a state corresponding to the one of said comparators which produces said comparison output signal to thereby provide a sign bit.

11. Conversion apparatus as set forth in claim 10, including a first operational amplifier for coupling said sample and hold means to said first input of said first comparator, said sample inverting means comprising a second operational amplifier with an input connected to a voltage divider means which is connected between the outputs of said first and second operational amplifiers, and said first and second comparators comprising third and fourth operational amplifiers, respectively.

12. Conversion apparatus as set forth in claim 10, wherein said sample and hold means comprises a first switch means and a holding capacitor, said first switch means being enabled to charge said holding capacitor to the potential of said analog input signal and disabled during said interval of time; and wherein said means to charge said capacitor to said first potential comprises second switch means connected between a source of said first potential and the interconnection of said first-mentioned capacitor and said resistance means, said second switch means being enabled prior to said interval of time to permit said first capacitor to charge to said first potential, and said second switch means being disabled during said interval of time to permit said capacitor to discharge through said resistance means toward said second potential.

13. Conversion apparatus as set forth in claim 8 wherein said means to step said counting means includes means to initialize said counting means in accordance with a compressed pulse coded digital input signal word, and means for decrementing said counting means, said apparatus further including means responsive to a zero count in said counting means to sample the resultant potential of said capacitor and to use that potential for the magnitude of a decoded analog output signal.

14. Conversion apparatus as set forth in claim 13 further including output means, inverting means for deriving an inverted potential which is substantially equal in magnitude and opposite in polarity to said resultant potential, timing control means, and output switch means operative in response to said timing control means to extend to said output means, at a predetermined time in each operating cycle of said converison apparatus, said resultant potential whenever the sign bit of said input signal word indicates positive polarity and said inverted potential whenever said sign bit indicates negative polarity.

15. Conversion apparatus as set forth in claim 13 wherein said means to charge said capacitor to said first potential comprises first switch means connected between a source of said first potential and the interconnection of said capacitor and said resistance means, said first switch means being enabled prior to said interval of time to permit said capacitor to charge to said first potential, and said first switch means being disabled during said interval of time.

16. Conversion apparatus as set forth in claim 15 wherein said means responsive to a zero count in said counting means to sample said resultant potential comprises second switch means connected between a source of said second potential and said resistance means, said second switch means being enabled during said interval of time and being disabled responsive to said zero count in said counting means, so that the potential held on said capacitor corresponds to said sample.

17. Conversion apparatus as set forth in claim 16 including output means, a first operational amplifier with an input connected to the interconnection of said capacitor and said resistance means, and a second operational amplifier with an input connected to voltage dividing means connected between outputs of said first and second operational amplifiers for inverting the polarity of said sample, third and fourth switch means connected to said outputs of said first and second operational amplifiers respectively, a bistable device for storing a sign bit of said compressed pulse coded digital signal word for indicating the polarity of said analog signal, and control means responsive to said counting means and said bistable device to enable said third switch means to extend the output of said first operational amplifier to said output means for an analog signal of one polarity, and to enable said fourth switch means to extend the output of said second operational amplifier to said output means for an analog signal of the opposite polarity.

* * * * *